United States Patent
Frickey et al.

(10) Patent No.: US 9,543,019 B2
(45) Date of Patent: Jan. 10, 2017

(54) ERROR CORRECTED PRE-READ FOR UPPER PAGE WRITE IN A MULTI-LEVEL CELL MEMORY

(71) Applicant: Intel Corporation, Santa Clara, CA (US)

(72) Inventors: Robert E. Frickey, Sacramento, CA (US); Yogesh B. Wakchaure, Folsom, CA (US); Iwen Chao, Sacramento, CA (US); Xin Guo, San Jose, CA (US); Kristopher H. Gaewsky, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 35 days.

(21) Appl. No.: 13/710,913

(22) Filed: Dec. 11, 2012

(65) Prior Publication Data

US 2014/0164872 A1   Jun. 12, 2014

(51) Int. Cl.
*G06F 11/10* (2006.01)
*G11C 16/10* (2006.01)
*G11C 11/56* (2006.01)

(52) U.S. Cl.
CPC .......... *G11C 16/10* (2013.01); *G06F 11/1048* (2013.01); *G11C 11/5628* (2013.01)

(58) Field of Classification Search
CPC . G06F 11/1076; G06F 11/108; G06F 11/1008; G06F 11/106; G06F 11/1048; G11C 2029/0411; G11C 16/10; G11C 11/5628
USPC ........................................................ 714/764
See application file for complete search history.

(56) References Cited

U.S. PATENT DOCUMENTS

| | | | |
|---|---|---|---|
| 2009/0043951 A1* | 2/2009 | Shalvi et al. | 711/103 |
| 2010/0002506 A1* | 1/2010 | Cho et al. | 365/185.03 |
| 2010/0049904 A1* | 2/2010 | Chen | 711/103 |
| 2010/0235715 A1* | 9/2010 | Thatcher et al. | 714/763 |
| 2011/0029718 A1* | 2/2011 | Frickey et al. | 711/103 |
| 2013/0145093 A1* | 6/2013 | Kaminaga et al. | 711/114 |
| 2014/0164870 A1* | 6/2014 | Sun et al. | 714/764 |

OTHER PUBLICATIONS

ONFI, "Open Nand Flash Interface Specification", Revision 3.0, Mar. 9, 2011, 288 Pages.

* cited by examiner

*Primary Examiner* — Albert Decady
*Assistant Examiner* — Kyle Vallecillo
(74) *Attorney, Agent, or Firm* — Alpine Technology Law Group LLC (57) ABSTRACT

Methods, apparatuses and articles of manufacture may receive a first page of data and correct one or more errors in the first page of data to generate a page of corrected data. A program command may then be sent with a second page of data and the page of corrected data, to program a page of memory to store the second page of data.

13 Claims, 6 Drawing Sheets

ERROR CORRECTED PRE-READ FOR UPPER PAGE WRITE IN A MULTI-LEVEL CELL MEMORY

BACKGROUND

Technical Field

The present subject matter relates to semiconductor memories, and more specifically, to multi-level cell (MLC) flash memory.

Discussion

Many types of semiconductor memory are known in the art. Some memory is volatile and will lose its contents if power is removed. Some memory is non-volatile and will hold the information stored in the memory even after power has been removed. One type of non-volatile memory is flash memory which stores charge in a charge storage region of a memory cell. In a floating gate flash cell, a conductive floating gate, positioned between the control gate and the channel of a metal-oxide silicon field effect transistor (MOSFET), is used to store a charge. In a charge trap flash (CTF) cell, a layer of non-conductive material, such as a nitride film, is used to store charge between the control gate and the channel of a MOSFET. The voltage threshold of the MOSFET-based flash cell can be changed by changing the amount of charge stored in the charge storage region of the cell, and the voltage threshold can be used to indicate a value that is stored in the flash cell.

Some flash devices may store a single binary bit of data per cell. Such flash cells may be referred to as single-level cells (SLC). Other flash devices may allow for more than one binary bit of data to be stored in a single flash cell by using multi-level cells (MLC). In an MLC, the voltage threshold of the flash cell may be set to one of $2^n$ different target levels to represent 'n' bits of storage. So for example, an MLC capable of storing 3 bits of information may have 8 different targeted voltage levels for its voltage threshold.

One architecture in common use for flash memories is a NAND flash architecture. In a NAND flash architecture, two or more flash cells are coupled together, source to drain, into a string, with the individual cell control gates coupled to control lines, such as word lines. Select gates, which may be standard MOSFETs, may be coupled to the NAND string at either end, to couple the NAND string to a source line at one end of the NAND string, and to a bit line at the other end of the NAND string. Some NAND flash memories may use MLCs to increase storage density.

BRIEF DESCRIPTION OF THE DRAWINGS

The accompanying drawings, which are incorporated in and constitute part of the specification, illustrate various embodiments. Together with the general description, the drawings serve to explain various principles. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Reference now is made in detail to the examples illustrated in the accompanying drawings and discussed below.

Figure 1:
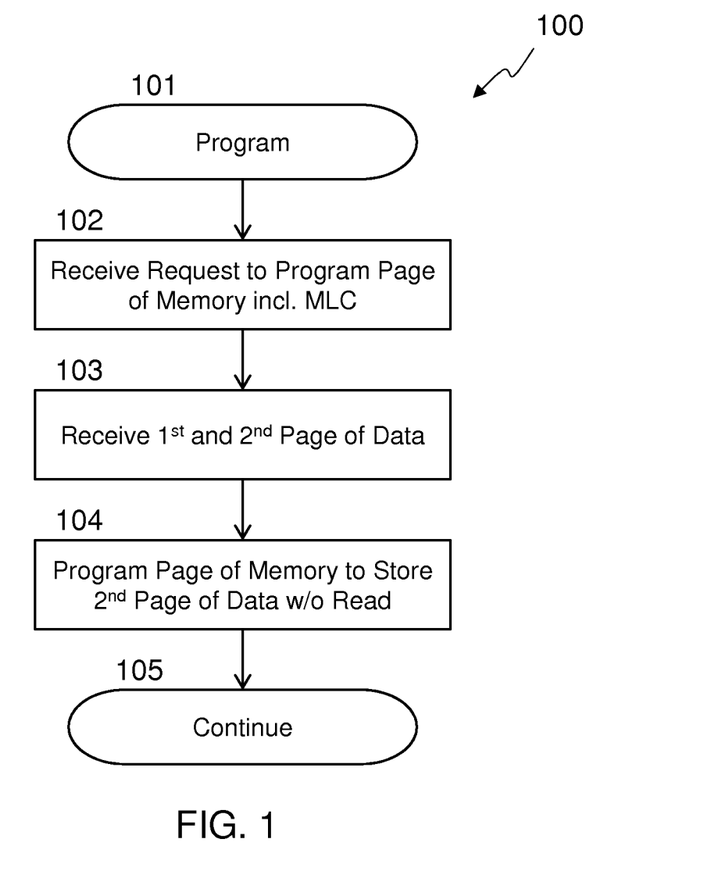
FIG. 1 is a flow chart of an embodiment of a method to program an electronic memory.
Figure 2B:
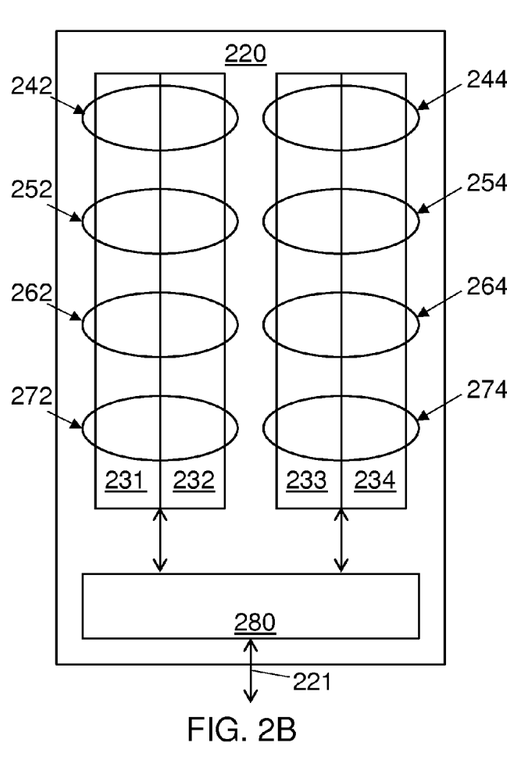
FIG. 2B is a block diagram of an electronic memory device suitable for use in an embodiment.
Figure 3:
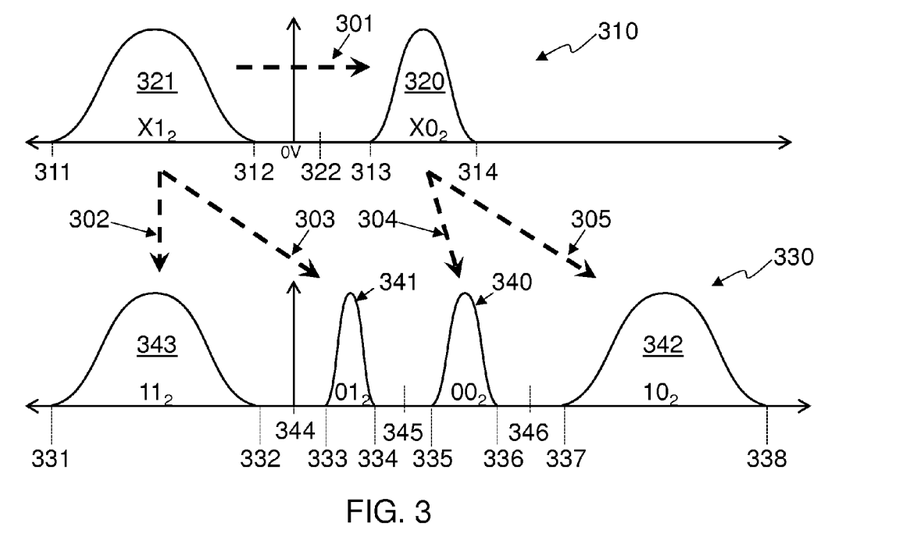
FIG. 3 shows various states of a multi-level cell (MLC) suitable for use in an embodiment.

FIG. 1 is a flow chart 100 of an embodiment of a method to program an electronic memory starting at block 101. At block 102 a request to program a page of memory comprising a multi-level cell (MLC) is received. A page of memory can be any amount of storage, depending on the embodiment, but refers to the smallest amount of memory that can be accessed in the electronic memory device. In some memory devices, a page may be as small as one binary bit of information, but other memory devices may use a page much larger, such as four kilobytes (4096×8 or 16,384 bits), or even larger. A MLC can store any number of bits of information, depending on the embodiment, and a current state of the MLC. In some embodiments, the MLC can store up to two bits of information by having its voltage threshold set to a level in one of four different voltage ranges. In other embodiments, the MLC can store any number of bits of information, including 4, 8, 16, or more, and may not be limited to powers of 2. The different bits of storage within an MLC may be referred to as different pages within the MLC. In some embodiments, the different pages within a single MLC may be assigned to different pages of memory, as shown in FIG. 2B. One of the bits stored in the MLC may be assigned to a lower page of the MLC and another one of the bits of the MLC may be assigned to an upper page of the MLC. One mapping of data values stored in the lower page and the upper page to voltage threshold of the MLC is shown in FIG. 3.

The request to program the page of memory may be initiated by various events, depending on the embodiment. In one embodiment, a controller, such as the solid-state drive controller shown in FIG. 2A, may send a program command to an electronic memory device which may be interpreted as a program request. In another embodiment, an information technology system, such as that shown in FIG. 8, may write to a file, which may cause the operating system including a flash file management system to take various actions, including a program operation of the memory device which may be interpreted as a program request.

At block 103, a first page of data and a second page of data may be received. The first page of data and the second page of data may be associated with the program request. In some embodiments, a single transaction of a memory protocol may include both the program command and the first page of data and the second page of data. In other embodiments, multiple transactions of a bus protocol may be used, and in some embodiments, various inputs of a device may be manipulated by the device sending the data, and/or the device receiving the data, to exchange the data.

The page of memory may be programmed at block 104 to store the second page of data into the page of memory. During a period of time between the receipt of the program request at block 102 and the programming of the MLC, that MLC is not read. The MLC is programmed by setting the voltage threshold of the MLC to a level that is based, in part, on the first page of data, as well as the second page of data that is being stored. The programming may also have the effect of programming another page of the MLC with the first page of data. Various other operations may continue at block 105.

Figure 2A:
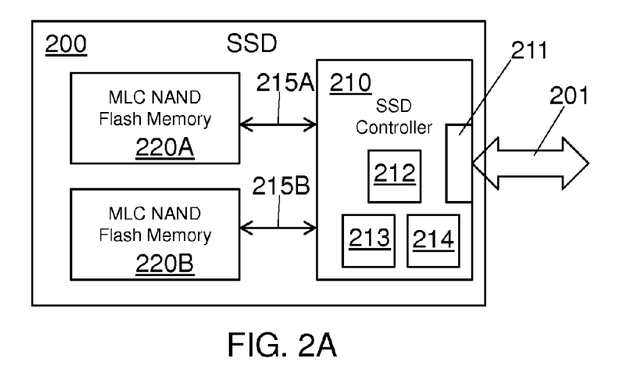
FIG. 2A is a block diagram of a solid state drive suitable for use in an embodiment.

FIG. 2A is a block diagram of a solid state drive (SSD) 200 suitable for use in an embodiment. The SSD 200 may have an external interface 201, which may be any type of physical or logical interface, and may be used to connect to a computer or other intelligent device such as a cell phone or digital camera using a standard or proprietary communication protocol. The SSD 200 may emulate a drive based on a spinning magnetic disk, or may implement other protocols. Examples of protocols that the external interface 201 may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express (PCI-e).

The SSD 200 may include a solid state drive controller 210 coupled to one or more MLC flash memory devices, such as MLC NAND flash memory 220A and MLC NAND flash memory 220B. The SSD controller 210 may include controlling circuitry 212 and circuitry 211 to interface to the external interface 201 of the SSD 200. The controller 212 may be a processor, microprocessor, microcontroller, finite state machine, or some other type of circuitry, which may, in some embodiments, execute instructions of a program, which may be stored on a non-transitory storage medium, such as volatile or non-volatile electronic memory 213. In some embodiments a program may be stored on one of the electronic memory devices coupled to the SSD controller 210, such as MLC NAND flash memory 220A. In other embodiments, any combination of one or more computer readable storage medium(s) may be utilized to store a program. A computer readable storage medium may be embodied as, for example, an electronic, magnetic, optical, electromagnetic, infrared, or semiconductor system, apparatus, or device, or other like storage devices known to those of ordinary skill in the art, or any suitable combination of computer readable storage mediums described herein. In the context of this document, a computer readable storage medium may be any tangible medium that can contain, or store a program and/or data for use by or in connection with an instruction execution system, apparatus, or device.

A program running on the controlling circuitry 212 may implement many different functions including, but not limited to, an operating system, a file system, memory block remapping, and error management, as well as various methods described herein. Other embodiments may provide for the methods described herein by providing other hardware or processors. Aspects of various embodiments are described with reference to flowchart illustrations and/or block diagrams of methods, apparatus, systems, and computer program products according to various embodiments disclosed herein. It will be understood that various blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The SSD controller 210 may also include memory 214, which may be called various names including status memory, write buffers, read buffers, scratchpad memory, or other names, to temporarily store data such as program status information, uncorrected data pages, corrected data pages, or other intermediate results that may be generated by the controlling circuitry 212. In some embodiments, the SSD controller 210 may be integrated onto a single integrated circuit, although some embodiments may use multiple integrated circuits and/or other circuitry for the SSD controller 210. In some embodiments, SSD controller 210 may be integrated with an MLC NAND flash memory for non-volatile memory storage. The SSD controller 210 may have one or more controller interfaces coupled to the one or more MLC memory devices 220A/B by one or more memory bus 215A/B. In some embodiments a separate memory bus may be used for individual MLC flash memory devices, but other embodiments may couple multiple MLC flash memory devices to a single memory bus. In some embodiments, the memory bus 215A/B may be compliant, at least in part, with a version of the Open NAND Flash Interface (ONFI) Specification such as the, the Open NAND Flash Interface (ONFI) Specification Revision 3.0, published on Mar. 9, 2011 by the ONFI Workgroup and available for download from www.onfi.org.

FIG. 2B is a block diagram of an electronic memory device 220 suitable for use in an embodiment. The electronic memory device 220 may have a memory interface 221 capable of coupling to the controller interface of the SSD controller 210. Circuitry 280 may couple to the memory interface 221 and to any number of pages of memory of any size, such as pages 231-234. The electronic memory device 220 may include any number of multi-level cells (MLCs), including MLCs 242, 244, 252, 254, 262, 264, 272, 274.

Figure 2C:
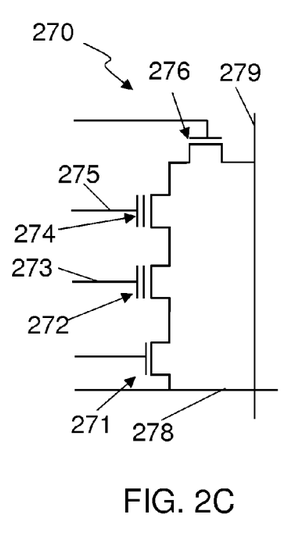
FIG. 2C is a schematic of a floating gate NAND flash string suitable for use in an embodiment.

The MLCs may be organized in any logical memory organization, but in some embodiments, the MLCs are organized into NAND strings as shown in FIG. 2C. FIG. 2C is a schematic of a floating gate NAND flash string 270 suitable for use in an embodiment. Although two MLC are included in the string 270 shown, any number of MLCs may be included in a NAND string in other embodiments. The NAND string 270 shown includes MLC 272 and MLC 274 from FIG. 2B coupled together to form a string. One end of the string may be coupled to a source line 278 through a select gate source field-effect transistor (FET) 271 and the other end of the string may be coupled to a bit line 279 by a select gate drain FET 276. A first word line 273 may be coupled to the control gate of the MLC 272 and a second word line 275 may be coupled to the control gate of the MLC 274. A voltage applied to the control gate of an MLC 272, 274 through a word line 273, 275 may allow the MLC 272, 274 to be conductive if the voltage at the control gate 273, 275 is higher than the threshold voltage ($V_t$) of the MLC 272, 274. If the voltage applied to the control gate is less than $V_t$, the MLC 272, 274 may be non-conductive.

The MLCs may store any number of bits of data per MLC, and in at least some embodiments, the bits of data stored in a single MLC may be assigned to separate pages of the memory device 220. Referring back to FIG. 2B, the various MLCs 242, 244, 252, 254, 262, 264, 272, 274 may, in the embodiment shown, individually store up to 2 bits of information that are assigned to different pages of memory. So in the embodiment shown, the first page of memory 231 includes the lower pages of the first MLC 242, the second MLC 252, the third MLC 262, and the fourth MLC 272, while the second page of memory 232 includes the upper pages of the first MLC 242, the second MLC 252, the third MLC 262, and the fourth MLC 272. The third page of memory 233 and fourth page of memory 234 respectively include the lower and upper pages of the fifth MLC 244, the sixth MLC 254, the seventh MLC 264 and the eighth MLC 274. If an MLC is able to store more than two bits of information, it may be split into more than two pages of memory in some embodiments.

FIG. 3 shows various states of a multi-level cell (MLC) suitable for use in an embodiment. The graphs 310, 330 show example statistical distributions of voltage thresholds of MLCs across multiple electronic memory devices in different states. The horizontal axes represent voltage and the vertical axes represent a relative number of individual MLCs that exhibit a voltage threshold at a particular voltage level. Graph 310 shows two different states of the MLC where only the lowest page of the MLC is programmed. The erased or $X1_2$, distribution curve 321 may cover a first range of voltages from $V_{EL}$ 311 to $V_{EH}$ 312 and may represent the erased state, which may be used to indicate that the lowest page of the MLC is storing a '1'. The $X0_2$ distribution curve 320 may cover a second voltage range from $V_{OL}$ 313 to $V_{OH}$ 314 and may be used to indicate that the lowest page of the MLC is storing a '0' without any upper pages being programmed. As a voltage equal to a lower page reference voltage ($V_{LP}$) 322 is applied to a control gate of an MLC, if the voltage threshold of the MLC is in the erased range 321, the MLC is conductive, but if the voltage threshold of the MLC is in the second range 320, the MLC is non-conductive. Thus, applying a voltage of $V_{LP}$ 322 to a control gate of an MLC may be useful for determining a value stored in the lower page of the MLC if no upper pages are programmed. While the specific voltage ranges may vary according to the embodiment, in one embodiment, $V_{EL}$ 311 may be about −2.5V, $V_{EH}$ 312 may be about −0.5V, $V_{OL}$ 313 may be about 0.8V, and $V_{OH}$ 314 may be about 1.8V, with $V_{LP}$ 322 at about 0.6V.

A first page of an MLC may be considered lower than a second page if the first page can be programmed without programming the second page. So graph 310 shows a lower page programmed while the graph 330 shows both the lower page and an upper page programmed. Note that if an MLC can store 3 bits of information, the MLC may have a lowest page, a middle page and a highest page. In that situation, the lowest page and the middle page are lower pages to the highest page, and the middle page and the highest page are upper pages to the lowest page.

Graph 330 shows four different states of the MLC where both a lower page and an upper page are programmed. The erased, or $11_2$, distribution curve 343 may cover a first range of voltages from $V_{EL}$ 331 to $V_{EH}$ 332 and may represent the erased state, which may be used to indicate that both the lower page and the upper page of the MLC are storing a '1'. In some embodiments, the erased state may be the same no matter how many pages of the MLC are programmed. The $01_2$ distribution curve 341 may cover a second voltage range from $V_{01L}$ 333 to $V_{01H}$ 334 and may be used to indicate that the lower page of the MLC is storing a '1' and the upper page of the MLC is storing a '0'. The $00_2$ distribution curve 340 may cover a third voltage range from $V_{00L}$ 335 to $V_{00H}$ 336 and may be used to indicate that the lower page of the MLC is storing a '0' and the upper page of the MLC is storing a '0', and the $10_2$ distribution curve 342 may cover a fourth voltage range from $V_{10L}$ 337 to $V_{10H}$ 338 and may be used to indicate that the lower page of the MLC is storing a '0' and the upper page of the MLC is storing a '1'. Three different upper page reference voltages are also shown, the $1^{st}$ upper page reference voltage ($V_{UP1}$) 344 may be a voltage between the erased distribution 343 and the $01_2$ distribution 341. The $2^{nd}$ upper page reference voltage ($V_{UP2}$), or middle upper page reference voltage 345 may be a voltage between the $01_2$ distribution 341 and the $00_2$ distribution 340, and the $3^{rd}$ upper voltage range ($V_{UP3}$) 346 may be between the $00_2$ distribution 340 and the $10_2$ distribution 342. While the specific voltage ranges may vary according to the embodiment, in one embodiment, $V_{EL}$ 331 may be about −2.5V, $V_{EH}$ 332 may be about −0.5V, $V_{01L}$ 333 may be about 0.4V, and $V_{01H}$ 334 may be about 0.8V, $V_{00L}$ 335 may be about 1.4V, and $V_{00H}$ 336 may be about 2.0V, $V_{10L}$ 337 may be about 2.8V, and $V_{10H}$ 338 may be about 4.5V, with $V_{UP1}$ 344 about 0.0V, $V_{UP2}$ 345 about 1.1V, $V_{UP3}$ 346 about 2.4V.

In many flash technologies, programming a flash cell may increase $V_t$, not decrease it. To decrease $V_t$, the flash cell may be erased, which may erase a large number of other cells as well. The graphs 310, 330 also show possible programming possibilities. If the MLC is erased and in the $X0_2$ distribution 321, the lower page of the MLC may be programmed to a '0', as shown by arrow 301, by increasing the $V_t$ of the MLC to be in the $X0_2$ distribution 320, or it may be left in the $X0_2$ distribution 321 to indicate that the value stored in the lower page is a '1'. To 'program' the upper page as a '1' with the lower page a '1', arrow 302 shows the MLC being left in the erased distribution 343, which may be thought of as setting $V_t$, even though $V_t$ may not be changed. Arrow 303 shows the upper page programmed to '0' with the lower page at '1', with the MLC going to the $01_2$ distribution 341. If the lower page has been programmed to a '0' so that the MLC is in the $X0_2$ distribution 320, arrow 304 shows programming the upper page to a '0' by transitioning to the $00_2$ distribution 340, and arrow 305 programming the upper page to a '1' by transitioning to the $10_2$ distribution 342. Note that the arrows 301-305 show $V_t$ increasing or staying the same. Some embodiments may allow additional programming transitions, such as changing from the $01_2$ distribution 341 to the $00_2$ distribution 340, as long as the transition increases $V_t$, but other embodiments may only allow one programming operation to a page before erasing the page.

In the example shown in FIG. 3, the MLC is able to store two bits of information. If an MLC is capable of storing more than 2 bits of information, then $2^n$ voltage ranges may be defined for $V_t$ to allow 'n' bits to be stored in 'n' pages.

While some embodiments may not have the same restrictions, in at least one embodiment, the lowest page may be programmed first, then the successive higher pages programmed, until the highest page has been programmed. To program an upper page, the data stored in lower pages may be read first to allow the proper $V_t$ to be programmed based on the data previously stored in the lower pages and the data currently being programmed. Traditionally, the read of the lower pages has been done within the flash memory device, but because many flash devices do not include error correction logic, errors in the lower page may not have been corrected before the data was used to determine what value of $V_t$ to use to program an upper page, propagating errors.

Traditionally, the memory device itself has kept track of which pages had been programmed through the use of flag bits or other metadata that may have been stored in the flash device. But to get the metadata, the metadata may be read from other flash cells and may not have been available right away for use in responding to a read or program request. Because of this, traditionally, a read of the MLC may have first been done using the middle upper reference voltage 345, which may be slower than a read using the lower page reference voltage 322 due to the smaller gaps between ranges if multiple pages are programmed. If it was found that the upper page had not been programmed yet, a second access using the lower page reference voltage may have been performed by the memory device, slowing the read even further.

Figure 4:
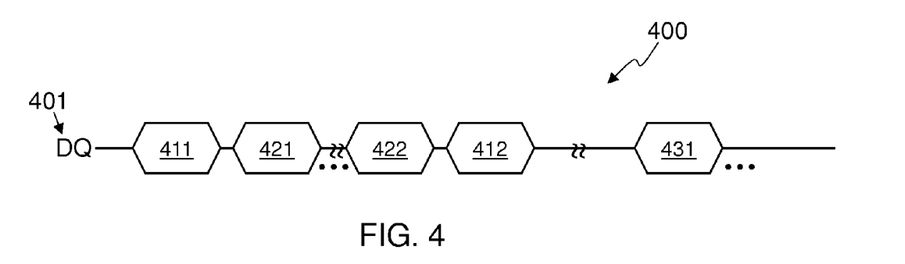
FIG. 4 shows a sample read command sequence of a bus protocol suitable for use in an embodiment.

FIG. 4 shows a sample read command sequence 400 of a bus protocol suitable for use in an embodiment. While other types of communication protocols may be used in some embodiments, a byte wide, multiplexed address/data (DQ) bus 401 is shown which may be similar to a bus defined in the ONFI specification. The communication may occur at any speed, but a symbol rate in the range of 10 megahertz (MHz) to 100 MHz may be typical. A first cycle of the access may be a command opcode for a read 411. The opcode value may vary depending on the type of read and the embodiment. An address 421, 422 may then be sent on the DQ lines 401 in one or more cycles. Any number of cycles may be used for the address depending on the storage capacity of the memory device and the page size. A second opcode or parameters 412 may be sent in some embodiments at the end of the read request. In at least one embodiment, a common starting opcode 411 for a read may be used for two different types of reads, with different parameters 412 sent to indicate the type of read. After some period of time, read data 431 may be returned in one or more cycles.

Figure 5:
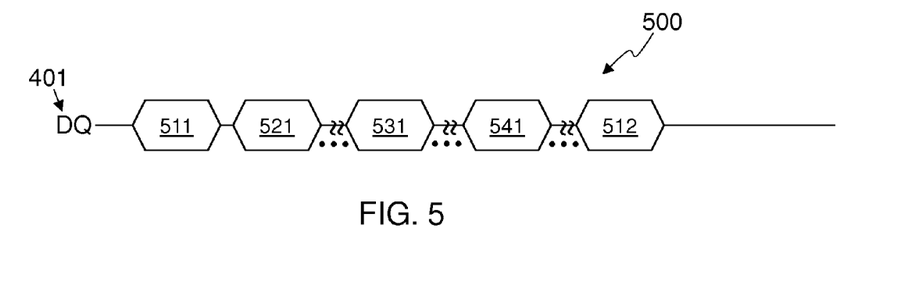
FIG. 5 shows a sample program command sequence of a bus protocol suitable for use in an embodiment.

FIG. 5 shows a sample program command sequence 500 of a bus protocol suitable for use in an embodiment. The program command may start with a command opcode for a program 511, followed by one or more cycles to send an address 521. A first page of data 531 may be sent in one or more cycles as well as a second page of data 541 sent in one or more cycles in some embodiments. Some embodiments may include a second opcode or parameter 512 that may be used for different program commands.

Figure 6:
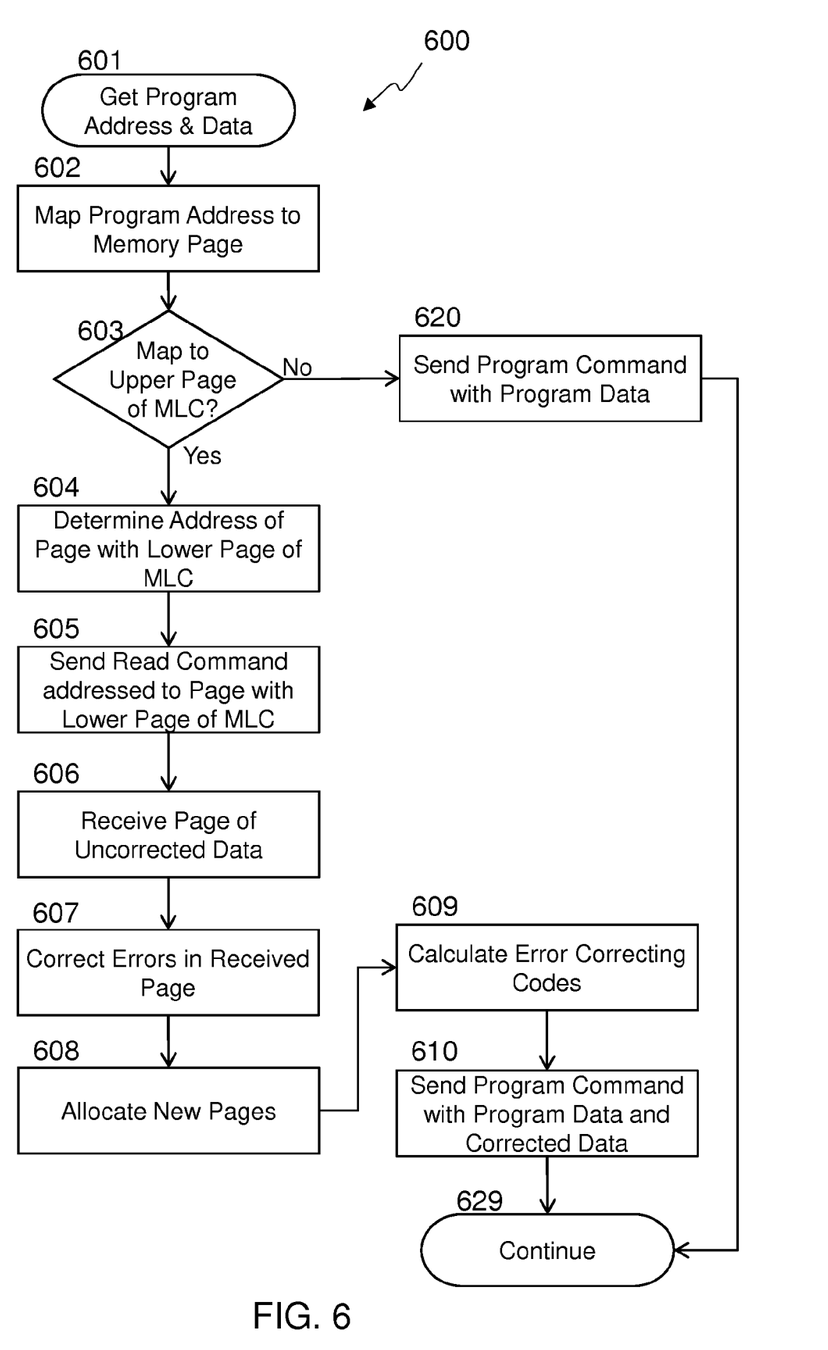
FIG. 6 is a flow chart of an embodiment of a method to program an electronic memory by a controller.

FIG. 6 is a flow chart 600 of an embodiment of a method to program an electronic memory by a controller. At block 601, the controller may initiate a program operation and get the program address and program data for the program operation. The program operation may be initiated by a disk write command sent to the controller of a solid-state drive or USB memory stick, storing a picture to a flash memory card in a digital camera, storing a downloaded app in a hand-held device such as a smart phone, or any other type of operation. The program address may be mapped to a targeted page of memory that includes one bit of an MLC at block 602. Mapping may map a logical address received to a physical address, and/or may include checking a table of bad pages of memory that have been reallocated to redundant or other pages of memory. At block 602 it may be determined if the targeted page of memory includes an upper page of the MLC, which may mean that the lower page of the MLC has been previously programmed. If the program address maps to a targeted page of memory that includes an upper page of an MLC in an electronic memory, the controller may then, at block 604, determine an address of an associated page of memory that includes a lower page of the MLC. The controller may then send a read command addressed to the associated page of memory through the controller interface at block 604, and then wait for the data from that page to be returned. At block 606, a page of uncorrected data may be received through the controller interface in response to the read command.

The page of uncorrected data may include error correcting codes that may allow one or more errors in the page of data to be detected and/or corrected. Several types of error correction codes are well known in the art, including, but not limited to, Hamming codes, Reed-Solomon codes, and Bose-Chaudhuri-Hocquenghem (BCH) codes. Depending on the size of the page of data, the number of error correcting codes that are included, and the type of codes chosen, one or more errors may be correctable or simply detected. At block 607 one or more errors in the first page of data may be corrected to generate a page of corrected data. If errors are detected that are not correctable, the controller may abort the program operation and report the error, leave one or more uncorrected errors in the page of corrected data, or set the page of corrected data to be all '1's to effectively make the corrupted page 'unprogrammed'.

If errors are detected, and/or corrected, and/or if non-correctable errors are left in the page of corrected data, new pages of memory may be allocated in the electronic memory at block 608 for the data and the old pages of memory associated with an MLC with errors, may be flagged as defective by the controller. If the MLC can store two bits of information, two new pages of memory may be allocated. Alternatively, the controller may determine if the memory device would have to decrease a voltage threshold in order to program the corrected data into the MLC, and allocate new pages of memory in that instance, but continue to use the original pages of memory if the program operation will increase the voltage threshold of the MLC. In some embodiments, new pages of memory may be allocated if the number of corrected errors exceeds a predetermined number while other embodiments may not include allocation of new pages but simply continue to use the existing pages of memory with errors.

At block 609, error correcting codes may be calculated for inclusion in the corrected page of data and/or a program page of data to be stored in the targeted page of memory. A program command may be sent through the controller interface, with a second page of data and the page of corrected data, to program the targeted page of memory to store the second page of data at block 610. In some cases, such as if new pages were allocated, the program command may include instructions to program two pages of memory to store the page of corrected data and the second page of data. The instructions may be included by using a particular opcode or by providing parameters with the program command. The controller may continue to operate at block 629.

In some embodiments, a verify command may be sent and/or results of a verify operation checked to make sure that the program command completed successfully.

If at block 603 it was determined that the program address maps to a targeted page of memory that includes a lower page of an MLC in an electronic memory, which may be interpreted as no upper page of the MLC yet programmed, the controller may then, at block 320, send a different program command to program the targeted page of memory to the program page of data. The program command that provides two pages of data may include a first opcode, while the different program command that provides one page of data may use a second opcode. In other embodiment, the two program commands may use a common opcode but provide different parameters as a part of the command.

Figure 7:
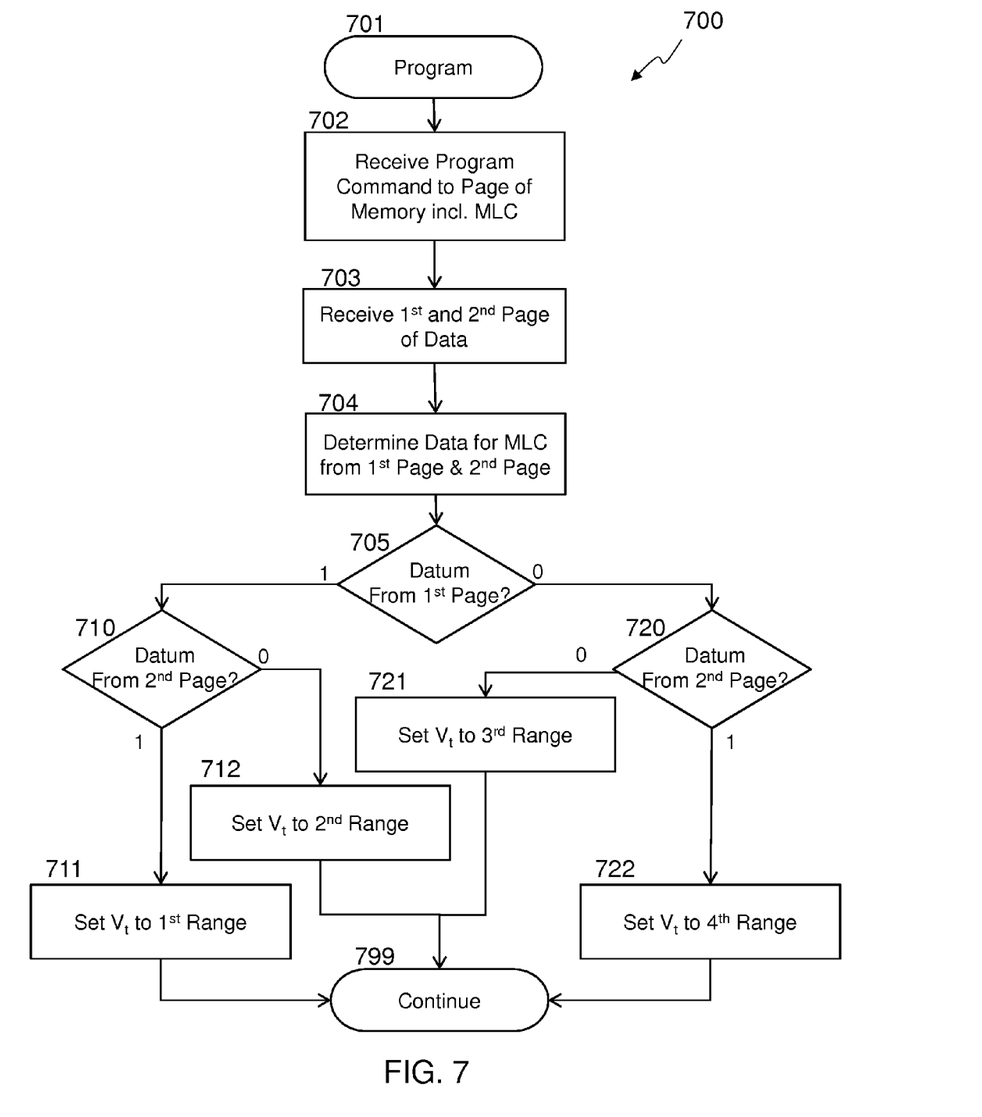
FIG. 7 is a flow chart of an embodiment of a method to program an electronic memory by an electronic memory device.

FIG. 7 is a flow chart 700 of an embodiment of a method to program an electronic memory by an electronic memory device starting at block 701. The flow chart 700 continues at block 702 by receiving a request to program a page of memory that includes an upper page of a multi-level cell (MLC). The request may be a program command received from an SSD controller, a processor, or some other device. A first page of data and a second page of data associated with the program request are received at block 703, and the remaining blocks of the flow chart 700 show programming the page of memory to store the second page of data, without reading the MLC between the receipt of the program request, and programming the MLC. A voltage threshold of the MLC after the programming is based, in part, on the first page of data. In some embodiments, the program request may also include a request to program the lower page of the MLC to store the first page of data, and the programming operation may also program the lower page of the MLC to store the first page of data.

In block 704 a first datum of the first page of data corresponding to a lower page of the MLC, and a second datum of the second page of data corresponding to the upper page of the MLC, may be determined. At block 705 the first datum is checked and depending on the value of the first datum, the second datum is checked at block 710 or block 720. The voltage threshold of the MLC, if the first datum is '1', is set to a voltage in a first range at block 711 or a second range at block 712, depending on a value of the second datum. The voltage threshold of the MLC, if the first datum is '0', is set to a voltage in a third range at block 721 or a fourth range at block 722, depending on the value of the second datum. The first range, the second range, the third range, and the fourth range are non-overlapping. So the MLC is set to a state based, at least in part, on the first datum and the second datum, where the state of the MLC is defined, at least in part, by the value of the voltage threshold of the MLC in the first range, the second range, the third range, or the fourth range. The details of the actual programming cycle to set a voltage threshold for the MLC may be dependent on a particular embodiment and are well known to one of ordinary skill, and are therefore not included herein. The memory device may continue to operate at block 799.

Figure 8:
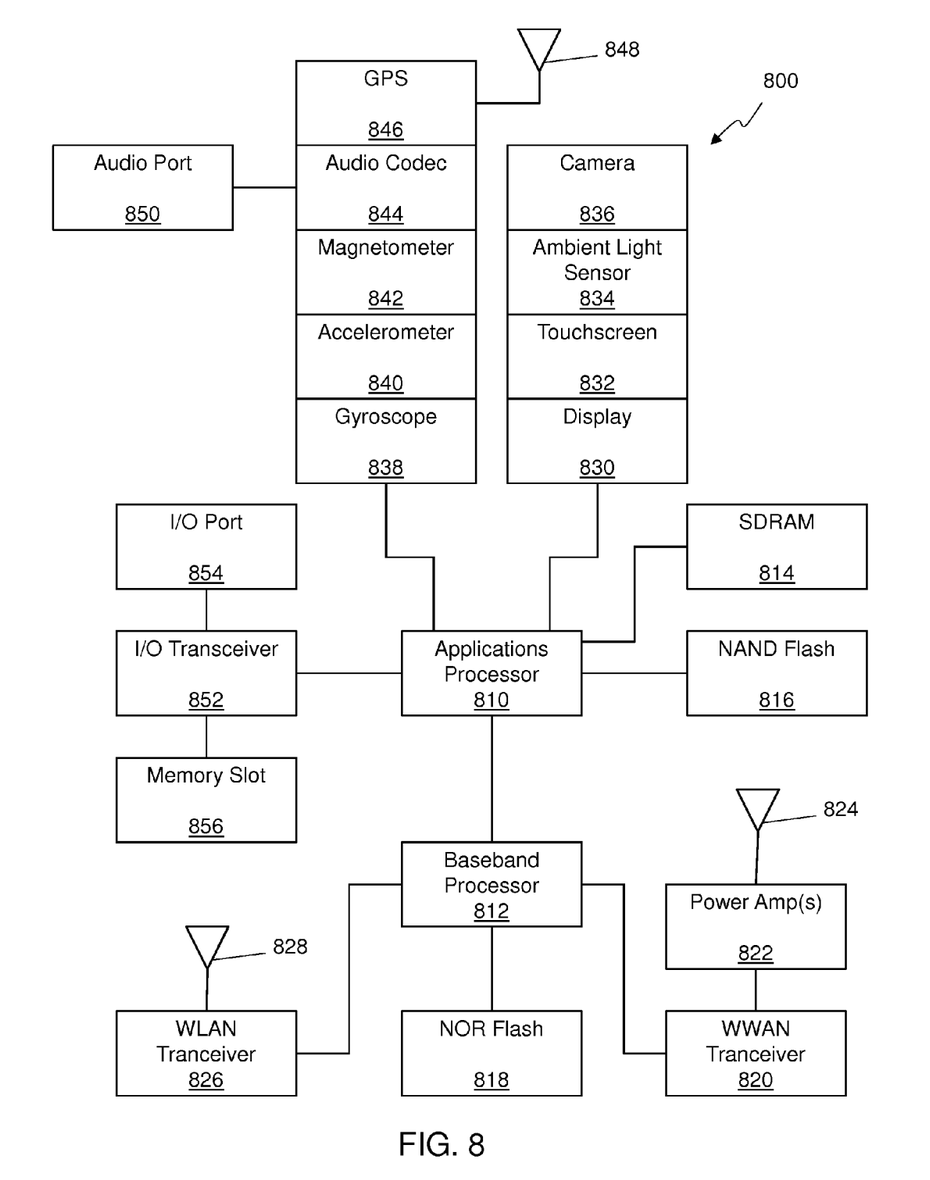
FIG. 8 is a block diagram of an information handling system using one or more embodiment.

Referring now to FIG. 8, a block diagram of an information handling system 800 may tangibly embody MLC memory 816, 818, embodiments or aspects of which may be shown in and described with respect to FIG. 1 through FIG. 7. Various controller function described in FIG. 1 through FIG. 7 may be performed by the applications processor 810, the baseband processor 812, or other controller blocks not shown. Information handling system 800 may represent a computer, a smartphone, a tablet, or any other type of information handling system. Although information handling system 800 represents one example of several types of computing platforms, information handling system 800 may include more or fewer elements and/or different arrangements of elements than shown in FIG. 8, and the scope of the claimed subject matter is not limited in these respects.

In one or more embodiments, information handling system 800 may include an applications processor 810 and a baseband processor 812. Applications processor 810 may be utilized as a general purpose processor to run applications and the various subsystems for information handling system 800. Applications processor 810 may include a single core or alternatively may include multiple processing cores wherein one or more of the cores may comprise a digital signal processor or digital signal processing core. Furthermore, applications processor 810 may include a graphics processor or coprocessor disposed on the same chip, or alternatively a graphics processor coupled to applications processor 810 may comprise a separate, discrete graphics chip. Applications processor 810 may include on board memory such as cache memory, and further may be coupled to external memory devices such as synchronous dynamic random access memory (SDRAM) 814 for storing and/or executing applications during operation, and NAND flash 816 for storing applications and/or data even when information handling system 800 is powered off. Baseband processor 812 may control the broadband radio functions for information handling system 800. Baseband processor 812 may store code for controlling such broadband radio functions in a NOR flash 818. Baseband processor 812 controls a wireless wide area network (WWAN) transceiver 820 which is used for modulating and/or demodulating broadband network signals, for example for communicating via a WiMAX network based on IEEE 802.16p or 3GPP LTE network or the like. The WWAN transceiver 820 couples to one or more power amps 822 respectively coupled to one or more antennas 824 for sending and receiving radio-frequency signals via the WWAN broadband network. The baseband processor 812 also may control a wireless local area network (WLAN) transceiver 826 coupled to one or more suitable antennas 828 and which may be capable of communicating via a Wi-Fi, Bluetooth, and/or an amplitude modulation (AM) or frequency modulation (FM) radio standard including an IEEE 802.11a/b/g/n standard or the like. It should be noted that these are merely example implementations for applications processor 810 and baseband processor 812, and the scope of the claimed subject matter is not limited in these respects. For example, any one or more of SDRAM 814, NAND flash 816 and/or NOR flash 818 may comprise other types of memory technology such as magnetic memory, chalcogenide memory, phase change memory, or ovonic memory, and the scope of the claimed subject matter is not limited in this respect.

In one or more embodiments, applications processor 810 may drive a display 830 according to embodiments described herein for displaying various information or data, and may further receive touch input from a user via a touch screen 832 for example via a finger or a stylus. An ambient light sensor 834 may be utilized to detect an amount of ambient light in which information handling system 800 is operating, for example to control a brightness or contrast value for display 830 as a function of the intensity of ambient light detected by ambient light sensor 834. One or more cameras 836 may be utilized to capture images that are processed by applications processor 810 and/or at least temporarily stored in NAND flash 816. Furthermore, applications processor may couple to a gyroscope 838, accelerometer 840, magnetometer 842, audio coder/decoder (CODEC) 844, and/or global positioning system (GPS) controller 846 coupled to an appropriate GPS antenna 848, for detection of various environmental properties including location, movement, and/or orientation of information handling system 800. Alternatively, controller 846 may comprise a Global Navigation Satellite System (GNSS) controller. Audio CODEC 844 may be coupled to one or more audio ports 850 to provide microphone input and speaker outputs either via internal devices and/or via external devices coupled to information handling system via the audio ports 850, for example via a headphone and microphone jack. In addition, applications processor 810 may couple to one or more input/output (I/O) transceivers 852 to couple to one or more I/O ports 854 such as a universal serial bus (USB) port, a high-definition multimedia interface (HDMI) port, a serial port, and so on. Furthermore, one or more of the I/O transceivers 852 may couple to one or more memory slots 856 for optional removable memory such as secure digital (SD) card or a subscriber identity module (SIM) card, although the scope of the claimed subject matter is not limited in these respects.

As will be appreciated by those of ordinary skill in the art, aspects of the various embodiments described above may be embodied as a system, method or computer program product. Accordingly, aspects of various embodiments may take the form of an entirely hardware embodiment, an entirely software embodiment (including firmware, resident software, micro-code, or the like) or an embodiment combining software and hardware aspects. Furthermore, aspects of the various embodiments may take the form of a computer program product embodied in one or more computer readable medium(s) having computer readable program code stored thereon.

The flowchart and/or block diagrams in the figures help to illustrate the architecture, functionality, and operation of possible implementations of systems, and methods of various embodiments. Various blocks in the flowcharts and block diagrams may represent hardware, software, or a combination, even within a single FIGURE. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

Examples of various embodiments are described in the following paragraphs:

An example method to program an electronic memory may include receiving a program request to program a page of memory comprising a multi-level cell (MLC), receiving a first page of data and a second page of data associated with the program request, and programming the page of memory to store the second page of data, without reading the MLC between the receipt of the program request, and programming the MLC. In the example method a voltage threshold of the MLC after the programming is based, at least in part, on the first page of data. In some example methods the page of memory includes an upper page of the MLC, another page of memory includes a lower page of the MLC, and the program request also includes a request to program the another page of memory to store the first page of data. Some example methods may also include determining a first datum of the first page of data corresponding to a lower page of the MLC, and a second datum of the second page of data corresponding to the upper page of the MLC, where the one bit of storage includes an upper page of the MLC, and the MLC is set to a state based, at least in part, on the first datum and the second datum. In some example methods the programming the page of memory includes setting the voltage threshold of the MLC, if the first datum has a first value, to a voltage in a first range or a second range, depending on a value of the second datum, and setting the voltage threshold of the MLC, if the first datum has a second value, to a voltage in a third range or a fourth range, depending on the value of the second datum. In some example methods the state of the MLC includes the value of the voltage threshold of the MLC in the first range, the second range, the third range, or the fourth range, and the first range, the second range, the third range, and the fourth range are non-overlapping. Some example methods may also include receiving the program request to program the page of memory using a memory communication protocol compliant, at least in part, with an Open NAND Flash Interface (ONFI) protocol. Any combination of the examples of this paragraph may be used in embodiments.

An example apparatus may include a multi-level cell (MLC), a first page of memory comprising a first page of the MLC, a second page of memory comprising a second page of the MLC, and circuitry coupled to the first page of memory and the second page of memory. In some example apparatuses the circuitry, in response to receipt of a program request to program the second page of memory that includes a first page of data and a second page of data, is capable to program the second page of memory to store the second page of data, without a read of the first page of memory between the receipt of the program request and a program operation to set a voltage threshold of the MLC, and the voltage threshold of the MLC after the program operation is based, at least in part, on the first page of data. In some example apparatuses the first page of the MLC is a lower page of the MLC, and the second page of the MLC is an upper page of the MLC. In some example apparatuses the program request also includes a request to program the first page of memory to store the first page of data. In some example apparatuses the circuitry further includes a network interface. In some example apparatuses the MLC is set to one of four states to store two bits of data based, at least in part, on the first page of data. Some example apparatuses may also include a memory interface to receive commands and exchange data compliant with a memory access protocol. In some example apparatuses the circuitry is further capable to detect a program command, addressed to the second page of memory, received by the memory interface, as the program request, determine a first datum of the first page of data corresponding to the lower page of the MLC, and a second datum of the second page of data corresponding to the upper page of the MLC, set the voltage threshold of the MLC, if the first datum has a first value, to a voltage in a first range or a second range, depending on a value of the second datum, and set the voltage threshold of the MLC, if the first datum has a second value, to a voltage in a third range or a fourth range, depending on the value of the second datum. In some example apparatuses the first range, the second range, the third range, and the fourth range are non-overlapping, and the four states comprise the value of the voltage threshold of the MLC in the first range, the second range, the third range, and the fourth range. In some example apparatuses the memory access protocol is compliant, at least in part, with an Open NAND Flash Interface (ONFI) protocol. Some example apparatuses may also include an electronic memory device comprising the first page of memory, the second page of memory, the memory interface, and at least some of the circuitry, and a controller comprising a controller interface, coupled to the memory interface, to send commands and exchange data compliant with the memory access protocol. In some example apparatuses the controller is capable to send a read command, addressed to the first page of memory, through the controller interface to the electronic memory device, receive a page of uncorrected data through the controller interface, from the electronic memory device, in response to the read command, correct one or more errors in the page of uncorrected data to create the first page of data, send the program command, addressed to the second page of memory, with the first page of data and the second page of data, through the controller interface to the electronic memory device. In some example apparatuses the controller includes a solid state drive controller, and I/O circuitry coupled to an external interface. In some example apparatuses the apparatus is a solid state drive. Any combination of the examples of this paragraph may be used in embodiments.

An example article of manufacture may include a non-transitory storage medium having instructions stored thereon that, if executed, result in receiving a first page of data, correcting one or more errors in the first page of data to generate a page of corrected data, and sending a program command, with a second page of data and the page of corrected data, to program a page of memory to store the second page of data. In some example articles of manufacture, the instructions, if executed, further result in calculating error correction codes for inclusion in the page of corrected data, and the second page of data. In some example articles of manufacture, the instructions, if executed, further result in communicating with a memory access protocol compliant, at least in part, with an Open NAND Flash Interface (ONFI) protocol. In some example articles of manufacture, the instructions, if executed, further result in mapping a program address to the page of memory, wherein the page of memory includes one bit of storage in a multi-level cell (MLC) in an electronic memory, and another page of memory includes another bit of storage in the MLC, determining an address of the another page of memory, and sending a read command addressed to the another page of memory, where the first page of data is received in response to the read command. In some example articles of manufacture, the instructions, if executed, further result in mapping a program address to a first page of memory, determining an address of the second page of memory, sending a read command addressed to the second page of memory, detecting at least one error in the page of uncorrected data, and allocating a third page and fourth page of memory comprising an lower page and upper page of another MLC, respectively, in response to the detection of the at least one error. The first page of memory may include an upper page of a multi-level cell (MLC) in an electronic memory, and a second page of memory includes a lower page of the MLC. The first page of data may be received in response to the read command, and the program command may include instructions to program the third and fourth page of memory to store the page of corrected data and the second page of data, respectively. In some example articles of manufacture, the instructions, if executed, further result in mapping another program address to a third page of memory including a lower page of another MLC, and sending a different program command to program the third page of memory to store a third page of data, where the program command includes a first opcode, and the different program command includes a second opcode. Any combination of the examples of this paragraph may be used in embodiments.

Example circuitry may include a controller, and a controller interface. The example controller may be capable to receive a first page of data through the controller interface, correct one or more errors in the first page of data to generate a page of corrected data, and send a program command through the controller interface, with a second page of data and the page of corrected data, to program a page of memory to store the second page of data. Some example controllers may also be capable to calculate error correcting codes for inclusion in the page of corrected data, and the second page of data. Some example controllers may also be capable to map a program address to the page of memory, determine an address of the another page of memory, and send a read command addressed to the another page of memory through the controller interface, where the first page of data is received in response to the read command. In some example circuitry the page of memory includes one bit of storage in a multi-level cell (MLC) in an electronic memory, and another page of memory includes another bit of storage in the MLC. In some example circuitry the page of memory includes an upper page of a multi-level cell (MLC) in an electronic memory, and another page of memory includes a lower page of the MLC. Some example controllers may also be capable to map a program address to a first page of memory, determine an address of the second page of memory, send a read command addressed to the second page of memory through the controller interface, detect at least one error in the page of uncorrected data, and allocate a third page and fourth page of memory comprising an lower page and upper page of another MLC, respectively, in response to the detection of the at least one error, where the first page of data is received in response to the read command, and the program command includes instructions to program the third and fourth page of memory to store the page of corrected data and the second page of data, respectively. Some example controllers may also be capable to map another program address to a third page of memory comprising a lower page of another MLC, and send a different program command to program the third page of memory to store a third page of data, where the program command includes a first opcode, and the different program command includes a second opcode. Some example circuitry may utilize an integrated circuit that includes the controller and the controller interface. Some example controllers may also be capable to communicate over the controller interface with a memory access protocol compliant, at least in part, with an Open NAND Flash Interface (ONFI) protocol. Any combination of the examples of this paragraph may be used in embodiments.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. A controller-based method to program a multi-level cell (MLC) memory, comprising:
   receiving, in a controller, a write command from a host device, the write command comprising a program address and program data;
   in response to the write command, mapping the program address to a targeted page of memory in the MLC memory; and
   determining, in the controller, whether the targeted page of memory comprises an upper page and a lower page, and in response to a determination that targeted page of memory comprises an upper page and a lower page:
      reading the lower page of the targeted page of memory to obtain lower page data, wherein the MLC memory has been programmed with the lower page data;
      error correcting the lower page data to generate error corrected lower page data;
      allocating one or more new pages of memory in the MLC memory;
      calculating an error correcting code to be included with the error corrected lower page data;
      determining whether the MLC memory would have to decrease a voltage threshold to program the error corrected lower page data, and in response to a determination that the MLC memory would have to decrease a voltage threshold to program the error corrected lower page data, programming the error corrected lower page data into the one or more new pages of memory in the MLC memory; and
      programming the MLC memory using the error corrected lower page data and the program data.

2. A method as claimed in claim 1, wherein said error correcting is performed with a controller coupled to the MLC memory.

3. A method as claimed in claim 1, wherein the MLC memory comprises NAND memory.

4. A method as claimed in claim 1, wherein said programming comprises programming the lower page with the error corrected lower page data, and programming the upper page with the new upper page data.

5. An apparatus, comprising:
   a memory including one or more multi-level cells (MLCs); and
   a controller coupled to the memory, wherein the controller is configured to:
      receive, in a controller, a write command from a host device, the write command including a program address and program data;
      in response to the write command, map the program address to a targeted page of memory in the one or more MLCs; and
      determine, in the controller, whether the targeted page of memory comprises an upper page and a lower page, and in response to a determination that targeted page of memory comprises an upper page and a lower page:
         read the lower page of the targeted page of memory to obtain lower page data, wherein the one or more MLCs have been programmed with the lower page data;
         error correct the lower page data;
         allocate one or more new pages of memory in the one or more MLCs;
         calculate an error correcting code to be included with the error corrected lower page data;
         determine whether the one or more MLCs would have to increase a voltage threshold to program the error corrected lower page data, and in response to a determination that the one or more MLCs would have to increase a voltage threshold to program the error corrected lower page data, programming the error corrected lower page data into the lower page of the targeted page of memory from which the lower page data was read; and
         program the one or more MLCs using the error corrected lower page data and the program data.

6. An apparatus as claimed in claim 5, wherein the memory comprises NAND memory.

7. An apparatus as claimed in claim 5, wherein the controller is further configured to program the lower page with the error corrected lower page data, and program the upper page with the new upper page data.

8. A solid-state disk (SSD), comprising:
   a bus interface;
   one or more memory devices including one or more multi-level cells (MLCs); and
   an SSD controller coupled to the one or more memory devices and to the bus interface, wherein the SSD controller is configured to:
      receive, in a controller, a write command from a host device, the write command comprising a program address and program data;
      in response to the write command, map the program address to a targeted page of memory in the one or more MLCs; and
      determine whether the targeted page of memory comprises an upper page and a lower page, and in response to a determination that targeted page of memory comprises an upper page and a lower page:
         read the lower page of the targeted page of memory to obtain lower page data, wherein the one or more MLCs have been programmed with the lower page data;
         error correct the lower page data;
         allocate one or more new pages of memory in the one or more MLCs;
         calculate an error correcting code to be included with the error corrected lower page data;
         determine whether the one or more MLCs would have to increase in a voltage threshold to program the error corrected lower page data, and in response to a determination that the one or more MLCs would have to increase a voltage threshold to program the error corrected lower page data, programming the error corrected lower page data into the lower page of the targeted page of memory from which the lower page data was read; and
         program the one or more MLCs using the error corrected lower page data and the program data.

9. A solid-state disk as claimed in claim 8, wherein the one or more memory devices comprise one or more NAND memory devices.

10. A solid-state disk as claimed in claim 8, wherein the SSD controller is further configured to program the lower page with the error corrected lower page data, and program the upper page with the new upper page data.

11. A solid-state disk as claimed in claim 8, wherein the SSD controller is further configured to:

determine whether the one or more MLCs would have to decrease a voltage threshold to program the error corrected lower page data, and in response to a determination that the one or more MLCs would have to decrease a voltage threshold to program the error corrected lower page data, programming the error corrected lower page data into the one or more new pages of memory in the one or more MLCs.

12. A method as claimed in claim 1, further comprising:
determining whether the MLC memory would have to increase a voltage threshold to program the error corrected lower page data, and in response to a determination that the MLC memory would have to increase a voltage threshold to program the error corrected lower page data, programming the error corrected lower page data into the lower page of the targeted page of memory from which the lower page data was read.

13. An apparatus as claimed in claim 5, wherein the controller is further configured to:
determine whether the one or more MLCs would have to decrease a voltage threshold to program the error corrected lower page data, and in response to a determination that the one or more MLCs would have to decrease a voltage threshold to program the error corrected lower page data, programming the error corrected lower page data into the one or more new pages of memory in the one or more MLCs.

* * * * *